United States Patent [19]
Tseng et al.

[11] Patent Number: 5,550,077
[45] Date of Patent: Aug. 27, 1996

[54] DRAM CELL WITH A COMB-TYPE CAPACITOR

[75] Inventors: Horng-Huei Tseng; Chih-Yuan Lu, both of Hsin Chu, Taiwan

[73] Assignee: Vanguard International Semiconductor Corporation, Hsinchu, Taiwan

[21] Appl. No.: 435,203

[22] Filed: May 5, 1995

[51] Int. Cl.$^6$ .............. H01L 21/70; H01L 27/00
[52] U.S. Cl. ................. 437/52; 437/60; 437/919
[58] Field of Search ............. 437/47–48, 52, 437/60, 919; 257/303, 306–310; 148/DIG. 14

[56] References Cited

U.S. PATENT DOCUMENTS

| | | | |
|---|---|---|---|
| 5,126,916 | 6/1992 | Tseng | 437/48 |
| 5,278,091 | 1/1994 | Fazan et al. | 437/52 |
| 5,292,677 | 3/1994 | Dennison | 437/52 |
| 5,340,765 | 8/1994 | Dennison et al. | 437/52 |
| 5,364,809 | 11/1994 | Kwon et al. | 437/52 |
| 5,364,811 | 11/1994 | Ajika et al. | 437/52 |
| 5,374,576 | 12/1994 | Kimura et al. | 437/48 |

*Primary Examiner*—H. Jey Tsai
*Attorney, Agent, or Firm*—George O. Saile

[57] ABSTRACT

An efficient method for manufacturing a comb-type capacitor for use as part of a DRAM cell in a silicon integrated circuit is described. A three toothed comb is created by first forming a central pedestal of polysilicon, providing oxide spacers on the vertical sides of said pedestal, coating said spacers with an additional layer of polysilicon, and then etching away said spacers thereby creating the comb structure. In addition to the comb, the method of the present invention also leads to the formation of a projecting rim of polysilicon that runs around all four sides of the capacitor structure, thereby further increasing its effective surface beyond that due to the comb.

16 Claims, 5 Drawing Sheets

DRAM CELL WITH A COMB-TYPE CAPACITOR

BACKGROUND OF THE INVENTION (1) Field of the Invention

The invention relates to the general field of silicon integrated circuits, more particularly to Dynamic Random Access Memories and capacitors used therein.

(2) Description of the Prior Art

Dynamic Random Access Memories (DRAMs), as used in silicon integrated circuits, represent semiconductor devices that offer information storage at very high densities. These high densities are a consequence of the fact that the basic cell of a DRAM (wherein a single bit of information is stored) comprises a single Field Effect Transistor (FET) and a capacitor. The minimum capacitance required for the basic cell to operate efficiently is about 20 femtofarads. This implies that the capacitor, rather than the FET, will be the limiting factor in determining how small the DRAM's basic cell can be made.

The value of a capacitor can be increased in any of three ways: the dielectric layer may be made thinner, its dielectric constant may be increased, and the area of the electrodes may be increased. The first two ways are limited by the availability of suitable materials with suitable properties such as breakdown strength, high frequency characteristics, etc. so that most of the work to reduce the physical size of the capacitor in a DRAM cell has concentrated on increasing the effective area of the electrodes without increasing the amount of space within the integrated circuit that is taken up by the capacitor.

One of the geometries that has been successfully used to increase the effective area of the capacitor electrodes is to shape the capacitor in the form of a rectangular prism, at least one of whose surfaces is dimpled in some way such as rectangular or cylindrical depressions. The comb-type capacitor is an example of this and is the geometry on which the present invention is based.

A number of processes for manufacturing a comb-type capacitor have been described in the prior art but none of these is completely satisfactory in that they are either unduly complicated or incorporate procedures that have the potential to lead to problems at a later stage. For example, Kwon et al. (U.S. Pat. No. 5,364,809 Nov. 15, 1994) describes a process that depends on the formation of oxide spacers that are supported by photoresist.

Other examples of patents that relate to comb-type capacitors include that of Dennison (U.S. Pat. No. 5,292,677 Mar. 8 1994) which relates to the DRAM cell as a whole, rather than to the capacitor, Kimura et al. (U.S. Pat. No. 5,374,576 Dec. 20, 1994) which teaches a modification of the capacitor geometry rather than an improved process for manufacturing it, and Lu et al. (U.S. Pat. No. 5,231,052 Jul. 27, 1993) which is concerned with the problem of making good electrical contact to a DRAM capacitor. Ajika et al. (U.S. Pat. 5,364,811 Nov. 15, 1994) describes the formation of a projecting rim on the surface of the capacitor (which is also a feature of the present invention). However, the rim described by Ajika is limited to one side of the capacitor whereas the rim that is described in the present invention runs around on four sides.

SUMMARY OF THE INVENTION

It has been an object of the present invention to describe an efficient method for manufacturing a comb-type capacitor that results in a reliable product.

A further object of the present invention has been to further increase the effective area of the capacitor electrodes (beyond what is achieved through the comb structure) by adding a projecting rim that runs around on all sides.

These objects have been achieved by using the following steps:

(a) providing a partially completed silicon integrated circuit structure comprising a plurality of FETs, each having source, drain, and gate regions, the electrode contacting said gate region having the shape of a hollow rectangle, one side contacting said gate region and the parallel side on a layer of field oxide, adjacent to said gate region and separated from it by said source region;

(b) then coating the structure with a first layer of silicon oxide, then with a layer of silicon nitride and then with a second layer of silicon oxide;

(c) then coating the structure with a first layer of polycrystalline silicon (poly);

(d) then coating the structure with a layer of photoresist, patterned to protect only that part of said first layer of poly that overlies said gate electrode and then etching said first layer of poly down to the level of said second layer of silicon oxide;

(e) then anisotropically etching said patterned layer of photoresist, thereby symmetrically reducing its width and exposing portions of said first layer of poly on either side of said photoresist pattern;

(f) then etching said first layer of poly until the thickness of the portion not protected by photoresist has been reduced by a factor of about 2 and then stripping said layer of photoresist;

(g) then isotropically coating the structure with a third layer of silicon oxide;

(h) then anisotropically etching all exposed horizontal surfaces of silicon oxide, thereby creating spacers on the vertical sidewalls of said first layer of poly, and exposing said layer of silicon nitride;

(i) then coating the structure with a conformal second layer of poly;

(j) then anisotropically etching said second layer of poly so as to remove all horizontal surfaces down to the level of said spacers and said silicon nitride layer, thereby creating a bottom capacitor electrode;

(k) then, through application of suitable etchants, removing said spacers, said layer of silicon nitride, and the last remnants of said first layer of silicon oxide and said layer of silicon nitride that underlie said first layer of poly, thereby forming a rim of poly projecting outwardly from the vertical wall of said first layer of poly and overhanging said gate electrode;

(l) then coating said bottom electrode with a layer of a capacitor dielectric; and (m) then coating said capacitor dielectric layer with a third layer of poly, thereby forming a top electrode.

DESCRIPTION OF THE PREFERRED EMBODIMENTS

This description of the preferred method for manufacturing the comb-type capacitor begins at a point in the manufacturing process where the integrated circuit is partially completed and comprises a plurality of Field Effect Transistors (FETs), each of which will form a single cell of the DRAM in combination with a comb-type capacitor.

Figure 1:
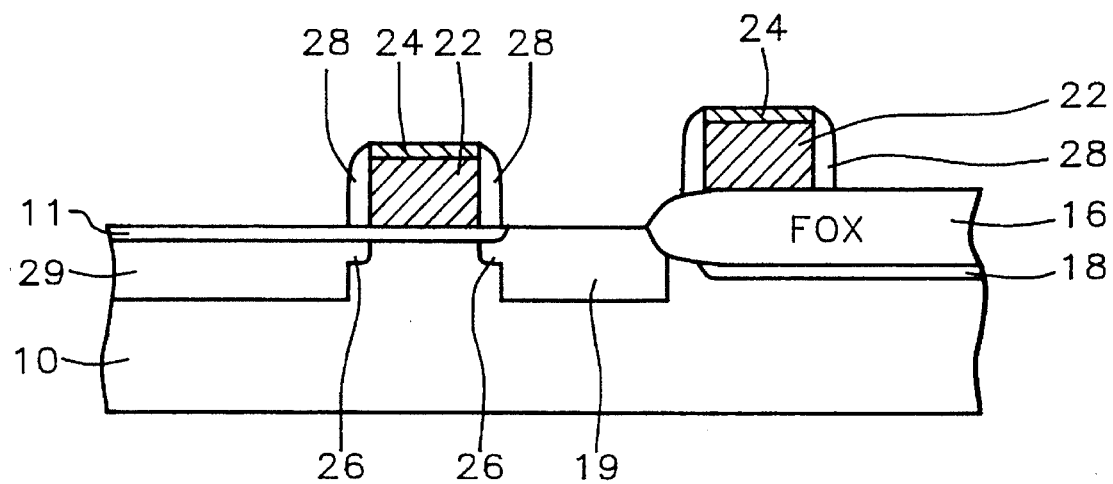
FIG. 1 is a schematic cross-section through a partially completed silicon integrated circuit, representing the starting point for the present invention.

Referring now to FIG. 1 we show, in schematic cross-section, a single FET formed on silicon body 10. The particular example shown here is of an FET that was produced by the Low Density Drain Self Aligned silicide (LDD salicide) process, but it will be understood by anyone skilled in this art that the capacitor forming method that is about to be described will work just as well for other types of FET, including both N-P-N and P-N-P types. Shown in FIG. 1 is source region 19, drain region 29 and gate oxide 11. While the major portions of both 19 and 29 comprise N+ silicon (in this example) each region includes a small subregion of N− silicon (designated 26 in FIG. 1) that underlies oxide spacers 28.

Gate electrode 22 in FIG. 1 has the shape of a hollow rectangle. In the cross-section used here, one edge of this rectangle is shown to overlie the gate oxide 11 while the parallel edge is shown as overlying Field Oxide (FOX) 16. Immediately underlying FOX 16 is a layer of P− material 18. It is there for reasons that have no bearing on the present invention, but is shown for the sake of completeness. The object of the method is to build the capacitor in the interior of the hollow rectangle that comprises the gate electrode.

Figure 2:
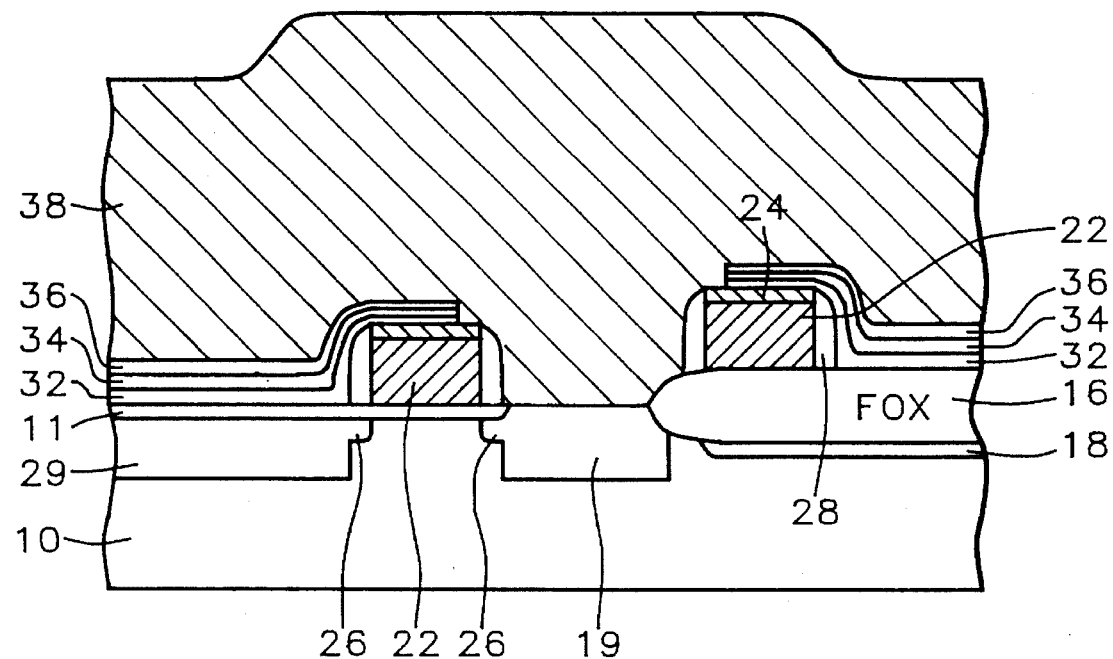
FIGS. 2 through 8 show succesive steps (all as schematic cross-sections ) that comprise the method of the present invention.

Referring to FIG. 2, the method begins with the deposition of first and second layers of silicon oxide (32 and 36 respectively) having a layer of silicon nitride 34 interposed between them. Standard photolithographic and etching techniques are used to remove said layers from the inside of the hollow rectangle that comprises gate electrode 22. The method that was used to deposit the two silicon oxide layers was Low Pressure Chemical Vapor Deposition (LPCVD) using a mix of $SiH_4$, $N_2O$, and $O_2$ at a temperature of 650° to 800° C. and a pressure of 225 to 275 millitorr, and their thicknesses were between 300 and 1,000 Angstrom units for the first oxide layer and between 200 and 1,500 Angstrom units for the second oxide layer. The method that was used to deposit the silicon nitride layer was LPCVD using $NH_3$ and $SiH_4$ at a temperature of 700° to 820° C. and a pressure of 315 to 385 millitorr, and its thickness was between 400 and 1,000 Angstrom units. This was then followed by deposition of a first layer of polycrystalline silicon (poly) 38 by means of LPCVD using 15% $PH_3$ flowing at rates between 190 to 210 SCCM and 85% $SiH_4$ flowing rates between 1000 to 1500 SCCM at a temperature of 500 ° to 650° C., to a thickness between 3,000 and 10,000 Angstrom units.

Figure 3:
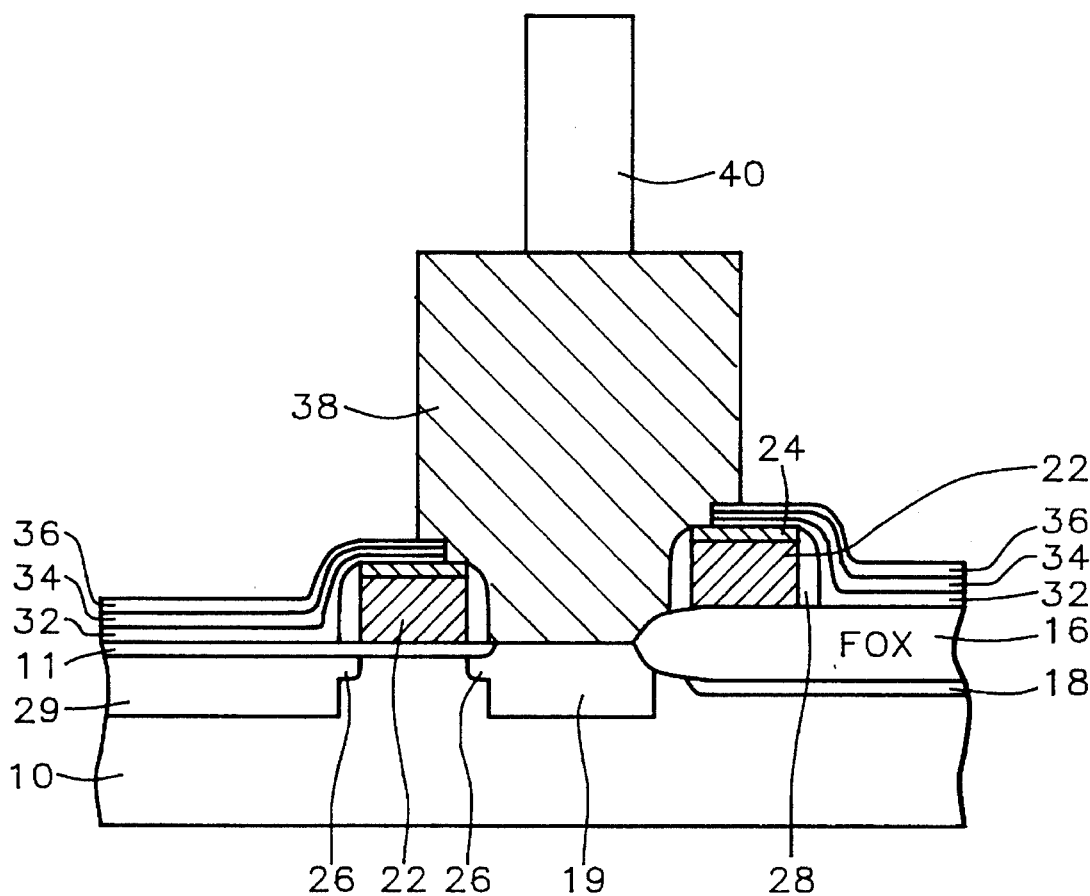

A photoresist mask is now applied and first poly 38 is etched away everywhere except within the hollow rectangle that comprises gate electrode 22. As shown in FIG. 3, first poly 38 just overlaps layers 32, 34, and 36 which were described above. Once this is done the initial photoresist mask (not shown here) is isotropically etched in an oxygen plasma so that its side surfaces are preferentially removed relative to its top surface, giving it the appearance shown in FIG. 3 where it is designated as 40.

Figure 4:
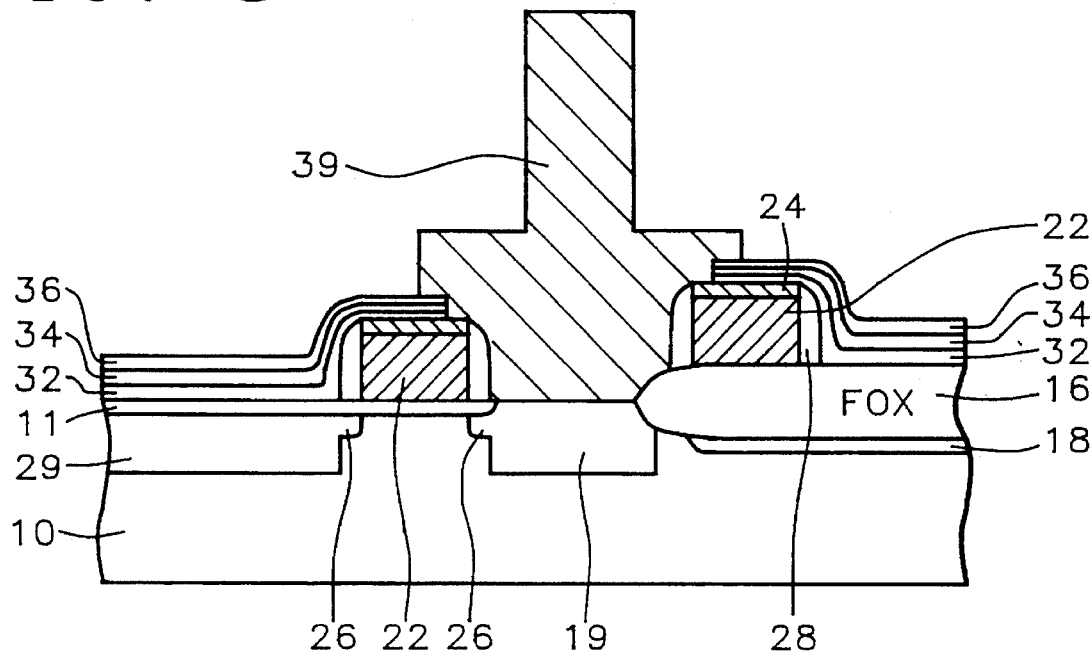
Figure 5:
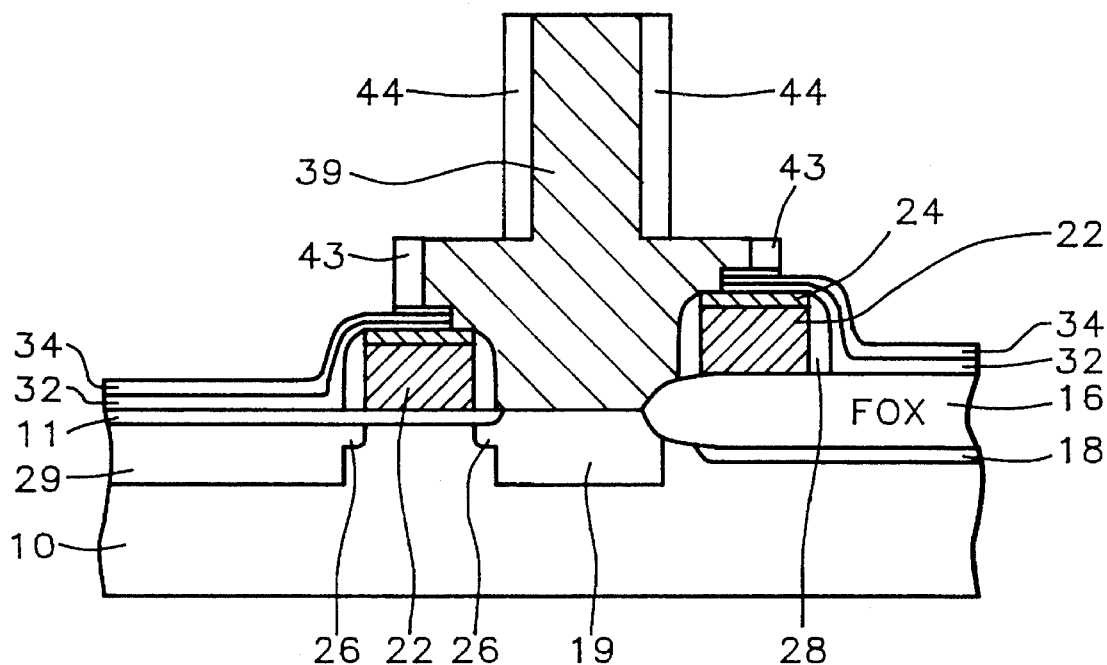

First poly layer 38 is now etched with photoresist mask 40 in place until it has been reduced to approximately half its pre-etch thickness, giving it the appearance illustrated in FIG. 4, including pedestal 39. This is followed by the deposition of an isotropic third layer of silicon oxide which is then anisotropically etched away from all horizontal surfaces, leaving oxide spacers 43 and 44 in place, as illustrated in FIG. 5. The thickness of the third silicon oxide layer was between 1,000 and 3,000 Angstrom units.

Figure 6:
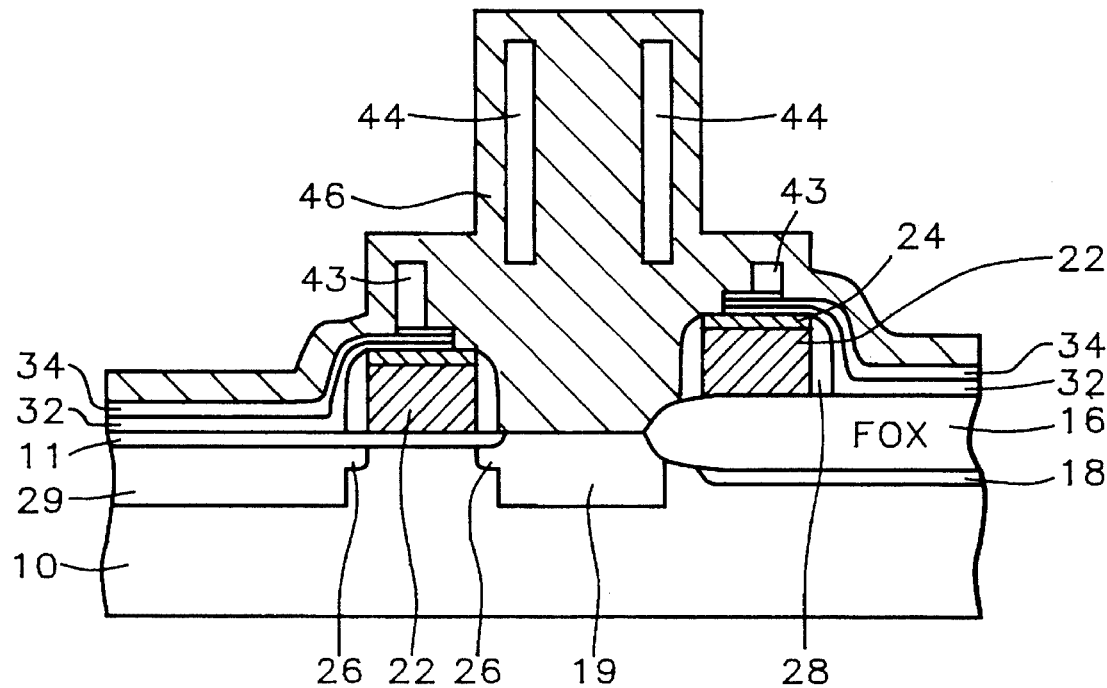

Referring to FIG. 6, a second, conformal layer of poly 46, between 1,000 and 3,000 Angstrom units thick, is now deposited over the existing poly giving the structure the appearance shown. Oxide spacers 43 and 44 are seen to be surrounded by poly.

Figure 7:
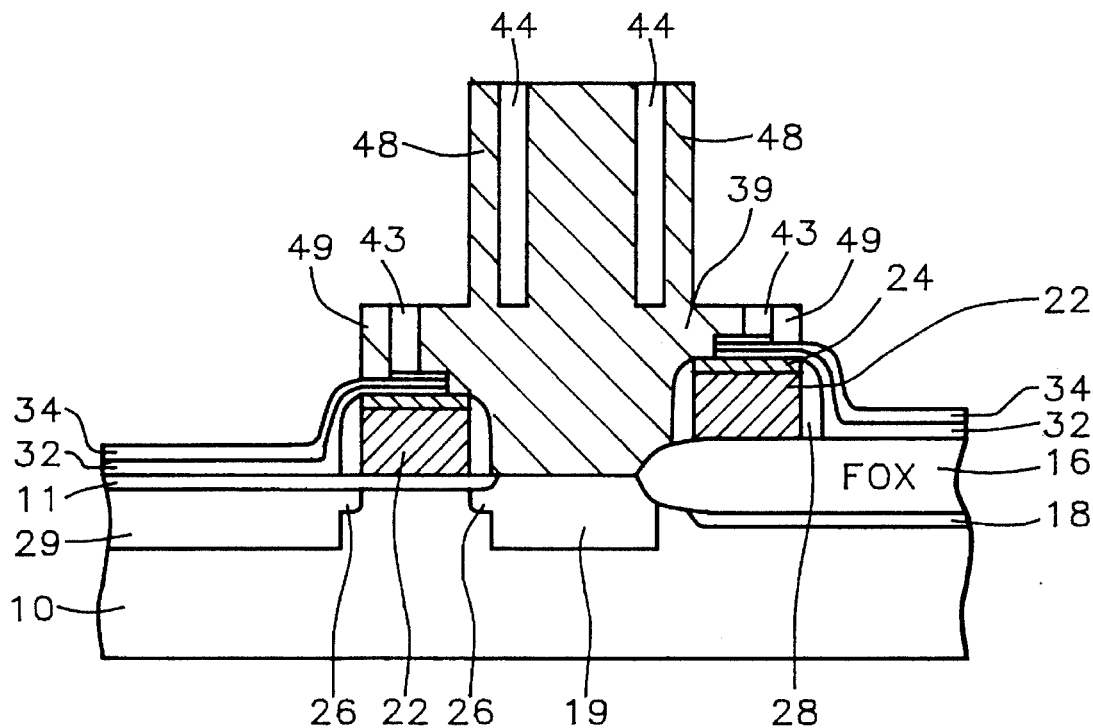

Second poly layer 46 is now anisotropically reactive ion etched using a Rainbow 4400 etcher (manufactured by Lam Research Co. USA) at a power level of 400 to 500 watts and a pressure of 400 to 500 millitorr in helium flowing at a rate of 160 to 200 Standard cc. per minute (sccm) and chlorine flowing at a rate of 380 to 460 sccm, down to the level of spacers 43 and 44 so as to just expose their upper ends, as illustrated in FIG. 7. Note that second poly layer 46 has also been removed from silicon nitride layer 34.

Figure 8:
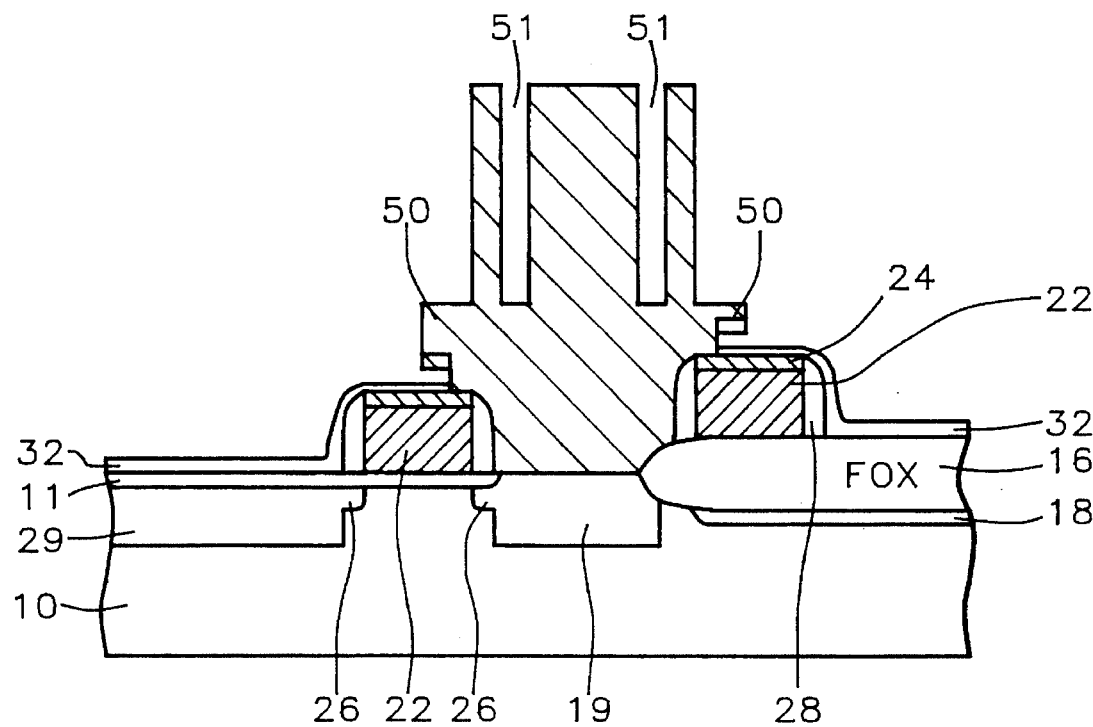

The structure is now subjected to etching in hydrofluoric acid thereby removing all exposed silicon oxide, in particular spacers 43 and 44, but not layer 32 which, at this stage, is protected by silicon nitride layer 34. This is followed by etching in a hot phosphoric acid solution which removes silicon nitride layer 34 but does not attack any exposed silicon oxide, giving the structure the appearance illustrated in FIG. 8. Note the presence, now, of overhanging rim 50 and open regions 51. The latter have the appearance of rectangular depressions in the surface of the poly structure when viewed from above (not shown here). The formation of 50 and 51 is readily seen to have greatly increased the surface area of the poly structure. Said poly structure is now ready to serve as a bottom electrode for the capacitor that is the end product of the method of the present invention.

Figure 9:
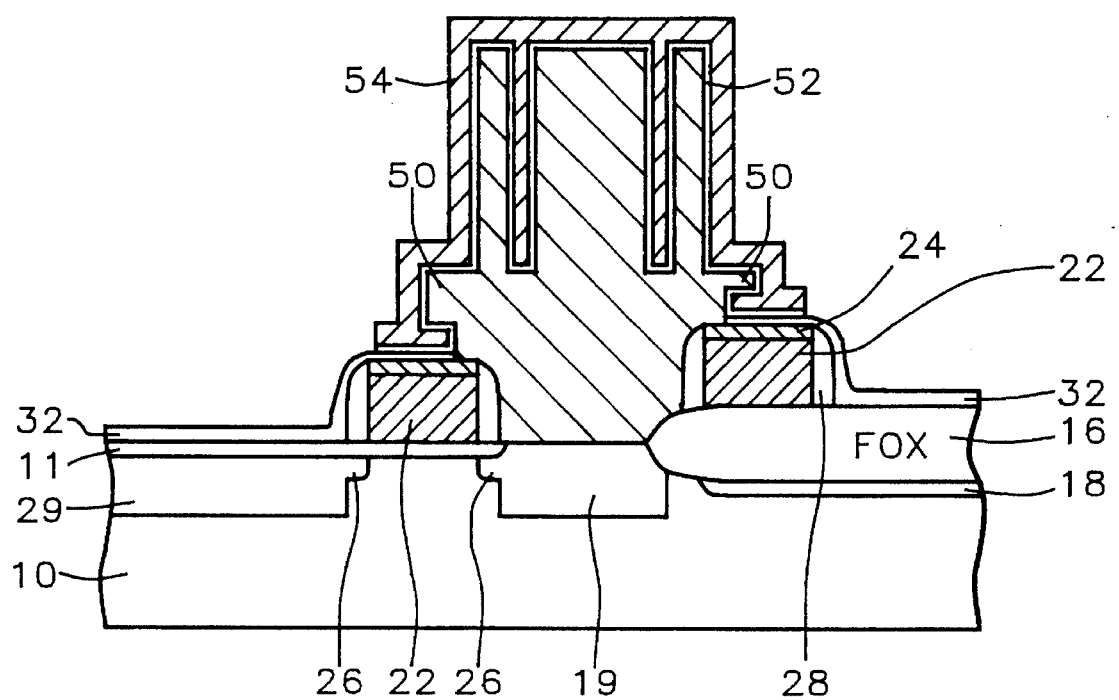
FIG. 9 is a schematic cross-section of the end-product of the present invention.

Referring now to FIG. 9, a capacitor dielectric layer 52 has been conformally deposited onto the surface of said bottom electrode to a thickness between 10 and 90 Angstrom units. Our preferred material for layer 52 has been a triple layer comprising $SiO_2/Si_3N_3/SiO_2$ (ONO) but any suitable dielectric material such as tantalum oxide could be used. The preferred method for depositing layer 52 has been:

Bottom O—expose poly to deionized water

Middle N—Low Pressure CVD, silane and ammonia, 700° to 800° C., 300 to 400 millitorr Top O—heat in dry oxygen, 800° to 900° C. for 25 to 35 minutes.

To complete fabrication of the capacitor a third poly layer 54 is deposited over dielectric layer 52 to a thickness between 1,000 and 3,000 Angstrom units, thereby providing a top electrode.

While the invention has been particularly shown and described with reference to this preferred embodiment thereof, it will be understood by those skilled in the art that various changes in form and details may be made without departing from the spirit and scope of the invention.

What is claimed is:

1. A method of manufacturing a comb-shape capacitor as part of a Dynamic Random Access Memory cell, comprising:

(a) providing a partially completed silicon integrated circuit structure comprising a plurality of Field Effect Transistors, each transistor having source, drain, and gate regions, said gate region having a first gate electrode formed on a gate oxide and a second gate electrode formed on a field oxide, said first and second gate electrodes are separated by said source region;

(b) then coating the structure with a first layer of silicon oxide, then with a layer of silicon nitride and then with a second layer of silicon oxide having an opening exposing said source region;

(c) then coating the structure with a first layer of polycrystalline silicon;

(d) then coating the structure with a layer of photoresist, patterned to protect only a part of said first layer of polycrystalline silicon that overlies said gate region and then etching said first layer of polycrystalline silicon down to an upper surface of said second layer of silicon oxide;

(e) then isotropically etching said patterned layer of photoresist, thereby symmetrically reducing its width and exposing portions of said first layer of polycrystalline silicon on either side of said photoresist pattern;

(f) then etching said first layer of polycrystalline silicon until a thickness of a portion of said first polycrystalline silicon layer not protected by photoresist has been reduced by a factor of about 2 to form vertical sidewalls and then stripping said layer of photoresist;

(g) then isotropically coating the structure with a third layer of silicon oxide;

(h) then anisotropically etching all exposed horizontal surfaces of third and second silicon oxide layers, thereby creating spacers on the vertical sidewalls of said first layer of polycrystalline silicon, and exposing said layer of silicon nitride;

(i) then coating the structure with a conformal second layer of polycrystalline silicon;

(j) then anisotropically etching said second layer of polycrystalline silicon so as to remove all horizontal surfaces down to upper surfaces of said spacers and said silicon nitride layer leaving portions of said second layer of polycrystalline silicon on sidewalls of said spacers, thereby creating a bottom capacitor electrode from said first and second polycrystalline silicon layers;

(k) then, removing said spacers, said layer of silicon nitride, said first layer of silicon oxide and said layer of silicon nitride that underlie said first layer of polycrystalline silicon, thereby forming a rim of polycrystalline silicon projecting outwardly from a vertical wall of said first layer of polycrystalline silicon and overhanging said gate region;

(l) then coating said bottom capacitor electrode with a layer of a capacitor dielectric; and (m) then coating said capacitor dielectric layer with a third layer of polycrystalline silicon, thereby forming a top capacitor electrode.

2. The method of claim 1 wherein coating first polycrystalline silicon comprises Low Pressure CVD with silane flowing at rates between 1000 and 1,500 SCCM and phosphine flowing at rates between 190 and 210 SCCM at a temperature between 500° and 650° C.

3. The method of claim 1 wherein coating first and second silicon oxide layers comprises Low Pressure Chemical Vapor Deposition using a mix of $SiH_4$, $N_2O$, and $O_2$ at a temperature between 650° and 800° C. and a pressure between 225 and 275 millitorr.

4. The method of claim 1 wherein coating silicon nitride comprises Low Pressure Chemical Vapor Deposition using $NH_3$ and $SiH_4$ at a temperature 700° and 820° C. and a pressure between 315 and 385 millitorr.

5. The method of claim 1 wherein a thickness of said first layer of polycrystalline silicon is between 3,000 and 10,000 Angstrom units.

6. The method of claim 1 wherein a thickness of said first layer of silicon oxide is between 300 and 1,000 Angstrom units.

7. The method of claim 1 wherein a thickness of said layer of silicon nitride is between 400 and 1,000 Angstrom units.

8. The method of claim 1 wherein a thickness of said second layer of silicon oxide is between 200 and 1,500 Angstrom units.

9. The method of claim 1 wherein isotropically etching photoresist comprises heating in an oxygen plasma.

10. The method of claim 1 wherein a thickness of said second layer of polycrystalline silicon is between 1,000 and 3,000 Angstrom units.

11. The method of claim 1 wherein a thickness of said third layer of silicon oxide is between 1,000 and 3,000 Angstrom units.

12. The method of claim 1 wherein anisotropically etching said second layer of polycrystalline silicon in step (j) further comprises reactive ion etching at a power level between 400 and 500 watts, at a pressure between 400 and 500 millitorr in helium flowing at a rate between 160 and 200 Standard cc. per minute and chlorine flowing at a rate between 380 and 460 Standard cc. per minute.

13. The method of claim 1 wherein a material that comprises said capacitor dielectric layer is selected from the group consisting of silicon dioxide, silicon nitride, and tantalum oxide.

14. The method of claim 1 wherein a thickness of said capacitor dielectric layer is between 10 and 90 Angstrom units.

15. The method of claim 1 wherein coating said capacitor dielectric further comprises:

exposing said second layer of polycrystalline silicon to deionized water;

performing Low Pressure CVD, using silane and ammonia, at between 700° and 800° C. at between 300 and 400 millitorr;

and heating in dry oxygen at between 800° and 900° C. for between 25 and 35 minutes.

16. The method of claim 1 wherein a thickness of said third layer of polycrystalline silicon is between 1,000 and 3,000 Angstrom units.

* * * * *